United States Patent
Olszewski et al.

(10) Patent No.: US 11,451,128 B2
(45) Date of Patent: Sep. 20, 2022

(54) FLOATING-GROUND ISOLATED POWER SUPPLY FOR AN ELECTRONIC CONVERTER

(71) Applicant: IFP Energies nouvelles, Rueil-Malmaison (FR)

(72) Inventors: Dimitri Olszewski, Rueil-Malmaison (FR); Alexandre Battiston, Rueil-Malmaison (FR)

(73) Assignee: IFP ENERGIES NOUVELLES, Rueil-Malmaison (FR)

(*) Notice: Subject to any disclaimer, the term of this patent is extended or adjusted under 35 U.S.C. 154(b) by 151 days.

(21) Appl. No.: 16/979,065

(22) PCT Filed: Feb. 27, 2019

(86) PCT No.: PCT/EP2019/054851
§ 371 (c)(1),
(2) Date: Sep. 8, 2020

(87) PCT Pub. No.: WO2019/170491
PCT Pub. Date: Sep. 12, 2019

(65) Prior Publication Data
US 2021/0057981 A1    Feb. 25, 2021

(30) Foreign Application Priority Data
Mar. 8, 2018  (FR) .................... 18/52.011

(51) Int. Cl.
*H02M 1/08*     (2006.01)
*H02M 3/335*    (2006.01)
*H03K 17/691*   (2006.01)
*H02M 1/00*     (2006.01)

(52) U.S. Cl.
CPC ......... *H02M 1/08* (2013.01); *H02M 3/33523* (2013.01); *H03K 17/691* (2013.01); *H02M 1/0006* (2021.05); *H02M 1/0009* (2021.05); *H03K 2217/0081* (2013.01)

(58) Field of Classification Search
CPC .. H02M 1/08; H02M 3/33523; H02M 1/0006; H02M 1/0009; H02M 1/00; H03K 17/691; H03K 2217/0081
See application file for complete search history.

(56) References Cited

FOREIGN PATENT DOCUMENTS

| | | |
|---|---|---|
| EP | 1988633 A1 | 11/2008 |
| JP | 2012-095409 A | 5/2012 |
| JP | 2012095409 A * | 5/2012 |

OTHER PUBLICATIONS

DEROOTMAETAL:"Developmentofa 1 MHz MOSFET gate-driver for integrated converters", Conference Record of The 2002 IEEE Industry Applications Conference:37TH IAS Annual Meeting;Oct. 13-18, 2002.*
International Search Report for PCT/EP2019/054851 dated May 22, 2019; English translation submitted herewith (6 pgs.).

* cited by examiner

*Primary Examiner* — Metasebia T Retebo
(74) *Attorney, Agent, or Firm* — Fitch, Even, Tabin & Flannery LLP

(57) ABSTRACT

The invention is an electronic power system (1) for energy conversion, comprising at least one electronic amplifier driver circuit (10), at least one floating-ground isolated power supply (11) and at least one digital computation unit (2) for generating control signals (12). The invention more specifically relates to a floating-ground isolated power supply (11) from control signals (12).

13 Claims, 2 Drawing Sheets

FLOATING-GROUND ISOLATED POWER SUPPLY FOR AN ELECTRONIC CONVERTER

CROSS-REFERENCE TO RELATED APPLICATIONS

Reference is made to International Application No. PCT/EP2019/054851, filed Feb. 27, 2019, which claims priority to French Patent Application No. 18/52.011, filed Mar. 8, 2018, the contents of which are incorporated herein by reference in their entirety.

BACKGROUND OF THE INVENTION

Field of the Invention

The present invention relates to electronic power systems, and more specifically to systems for converting energy between alternating current (AC) and direct current (DC). The present invention more specifically concerns the production of an isolated power supply generated from the energy conversion system.

Electronic power systems fulfil different functions according to the applications in which they are used. By way of non-limitative example, motor control for torque variation, source conversion between a DC electrochemical accumulator and an AC distribution network, voltage level adaptation between two DC sources, and power variation are notable different functions.

A large majority of these systems, involving power from a few tens of watts to several hundreds of kilowatts, are systems referred in the art to as switch-mode systems. They have semiconductor switches capable of switching, at high frequencies, high currents and voltages.

The semiconductor switches are controlled by electronic components or driver stages (referred to as drivers hereafter) which convert control signals from a digital computation unit, of DSP (Digital Signal Processor) or microcontroller type for example, into low-power control signals suited to different types of switches. Illustrated in FIG. 1a, is generic diagram of a power system of the state of the art comprising a driver which is further detailed in the remainder of the description.

Drivers, for high voltage levels, are isolated from the control circuits either by galvanic isolation (pulse transformer) or by opto-isolation (coupled photodiodes) in order to meet safety standards. In the state of the art drivers shown in FIG. 1b, a driver stage has a non-isolated voltage and current level amplifier driver (DD) with low-impedance outputs (referred to as push-pull or totem-pole) comprising a high level semiconductor switch and a low level one with one switch being blocked and the other switch being saturated which are associated with a pulse transformer (TI) for isolating the signals.

In these types of converters, floating-ground isolated power supplies are generally used for powering switch drivers or for powering voltage sensors that require for example a high-voltage power supply of the opto-isolation sensor type. By way of non-limitative example, the other low-power circuits require an isolated power supply in the system.

In the prior art, these floating-ground isolated power supplies are generated from a high voltage bus or from an auxiliary voltage source, with the addition of a dedicated and centralized switch-mode regulator for the rest of the circuits. This solution is often expensive and space-consuming on the printed circuit of the board. Moreover, the centralized power supply needs to be distributed to the various boards of the system and sized to power all the downstream circuits.

SUMMARY OF THE INVENTION

The present invention provides an isolated power supply for minimizing the costs and the size of the energy conversion system.

In order to achieve at least the aforementioned objectives, among others, the present invention provides, according to a first aspect, an electronic power system for energy conversion, comprising at least one driver, at least one floating-ground isolated power supply and at least one digital computation unit for generating control signals. The driver comprises an amplifier driver which sends the control signals to an associated pulse transformer. The invention is characterized by the floating-ground isolated power supply being connected to the amplifier driver output and the control signals are recovered and used to generate the floating-ground isolated power supply of the electronic power system.

According to a feature, the floating-ground isolated power supply comprises a transformer with a rectifier.

According to a feature, the rectifier of the floating-ground isolated power supply is a diode rectifier.

According to a feature, the electronic power system comprises an isolated current and voltage measuring device.

According to a feature, the amplifier driver is a non-isolated voltage and current level amplifier driver with a push-pull output.

According to a feature, the push-pull output of the amplifier driver is a combination of transistors.

According to a second aspect, the invention relates to a floating-ground isolated power supply comprising a transformer and a rectifier, characterized by being powered by an output of an amplifier driver of an electronic power system as described above.

The invention uses the control signals between the output of the amplifier driver (DD) and the input of the pulse transformer (TI) to generate floating isolated power supplies as shown in FIG. 2.

Thus, the control signals are advantageously sent to a new transformer (TA) with its rectifier, which may be a diode rectifier for example, in order to create a floating-ground isolated power supply. The transformation ratio of the transformer (TA) allows adjustment of the voltage level required by the consumer circuit. It is noted that, in a variant of the invention, a linear regulator can be added to stabilize the voltage at the output of transformer (TA).

BRIEF DESCRIPTION OF THE DRAWINGS

Other features and advantages of the invention will be clear from reading the description hereafter of an embodiment given by way of non-limitative example, with reference to the accompanying figures wherein:

FIG. 1 represents the state of the art with a generic diagram of a power system in accordance with the invention, FIG. 1b is a diagram of a prior art driver used in a power system of FIG. 1a.

DETAILED DESCRIPTION OF THE INVENTION

Electronic power system (1) provide several functions depending on the applications for which they are used, such as notably motor control for torque variation, source conversion between a DC electrochemical accumulator and an AC distribution network, voltage level adaptation between two DC sources and power variation.

As mentioned above, a large majority of these systems, which have power levels varying from a few tens of watts to several hundreds of kilowatts, are referred to as switch-mode systems. They have semiconductor switches (13) capable of switching, at high frequencies, high currents and voltages.

Figure 1A:
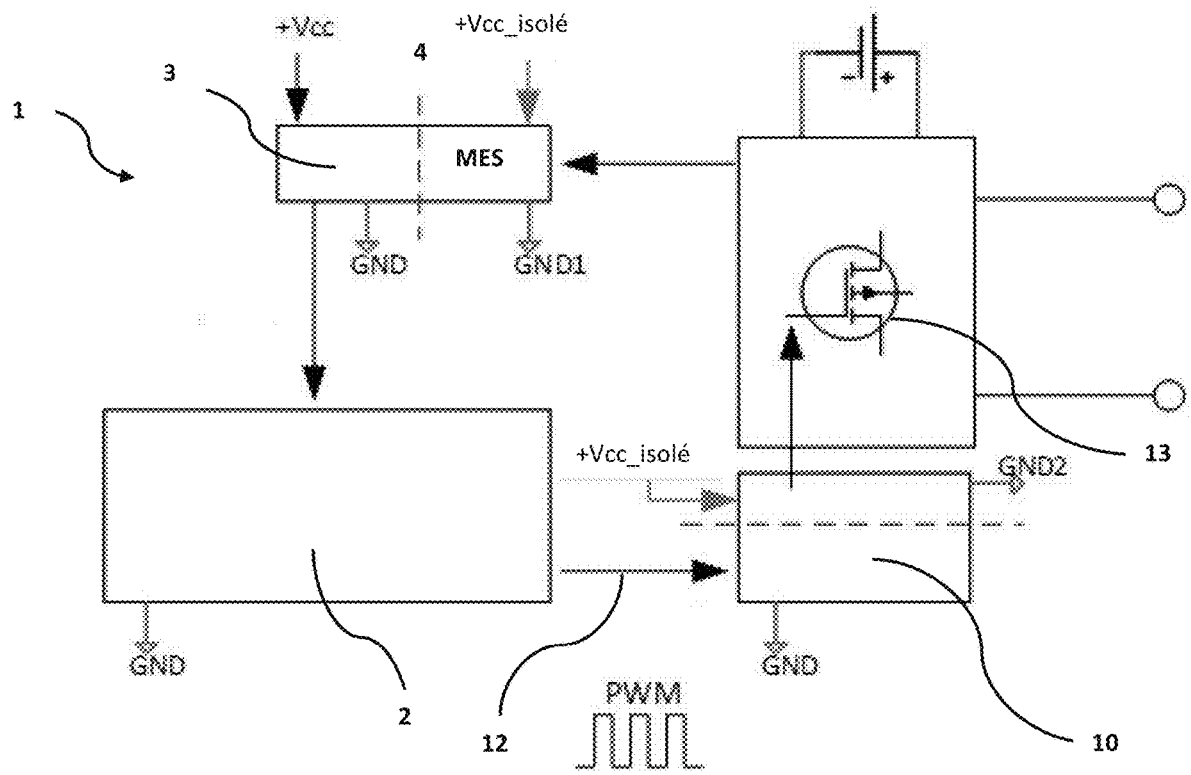

FIG. 1a illustrates, a block diagram, which functions of an electronic power system (also referred to as energy conversion system) as described and which is generally found in the state of the art. This diagram is also the one found within the invention described hereafter. In the figures, references to GND corresponds to the electrical ground.

Such an electronic system (1) comprises a measurement block MES made up of current and voltage measuring devices isolated from the high voltage side of the converter. This measurement block comprises sensors (3) isolated by an isolation system (4) between the input measurement and a conditioned output signal. This output measurement signal is suited to the usual voltage levels of a digital computation unit (2).

Electronic system (1) also comprises measurement conditioning devices, communication drivers and a digital computation unit (2). This part represents the core of the system where the operating logic of the system is implemented.

Furthermore, electronic system (1) comprises devices for controlling power semiconductors (13). In the case of high voltage conversion systems, these devices are isolated drivers (10). The semiconductors are driven by driver stages allowing conversion of control signals (12) from digital computation unit (2) to low power control signals suited to the switch types.

Electronic system (1) also comprises power switching devices, typically with MOSFET (Metal Oxide Semiconductor Field Effect Transistor) or IGBT (Insulated Gate Bipolar Transistor) semiconductors. These switches are connected between the output and the input of the system through an inductive energy accumulation system, typically a transformer for the isolated converters or an inductor for the non-isolated converters.

These switching devices can be controlled by use of a PWM (Power Width Modulation) method.

Figure 1B:
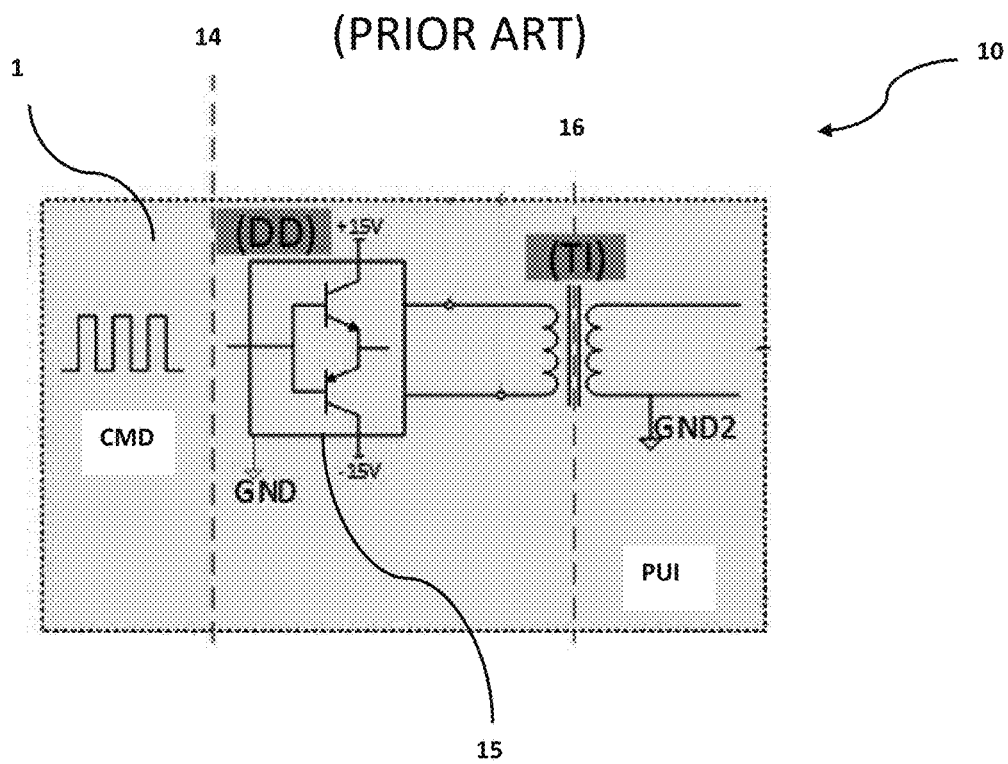

As can be seen in FIG. 1b, a prior art driver (10) has a non-isolated voltage and current level amplifier driver (DD) with push-pull outputs (15) associated with a pulse transformer (TI) for isolating the signals. Driver (10) also comprises a control part (CMD) and a power part (PUI). Control part (CMD) and amplifier driver (DD) are isolated by an isolation (14), which may be either a galvanic isolation (pulse transformer) or an opto-isolation (coupled photodiodes).

Push-pull outputs (15) of amplifier driver (DD) can be a combination of transistors. The voltages at the terminals of outputs (15) generally range between +15V and −15V. They can also be 0V.

Power part (PUI) and amplifier driver (DD) are also isolated by an isolation (16).

Figure 2:
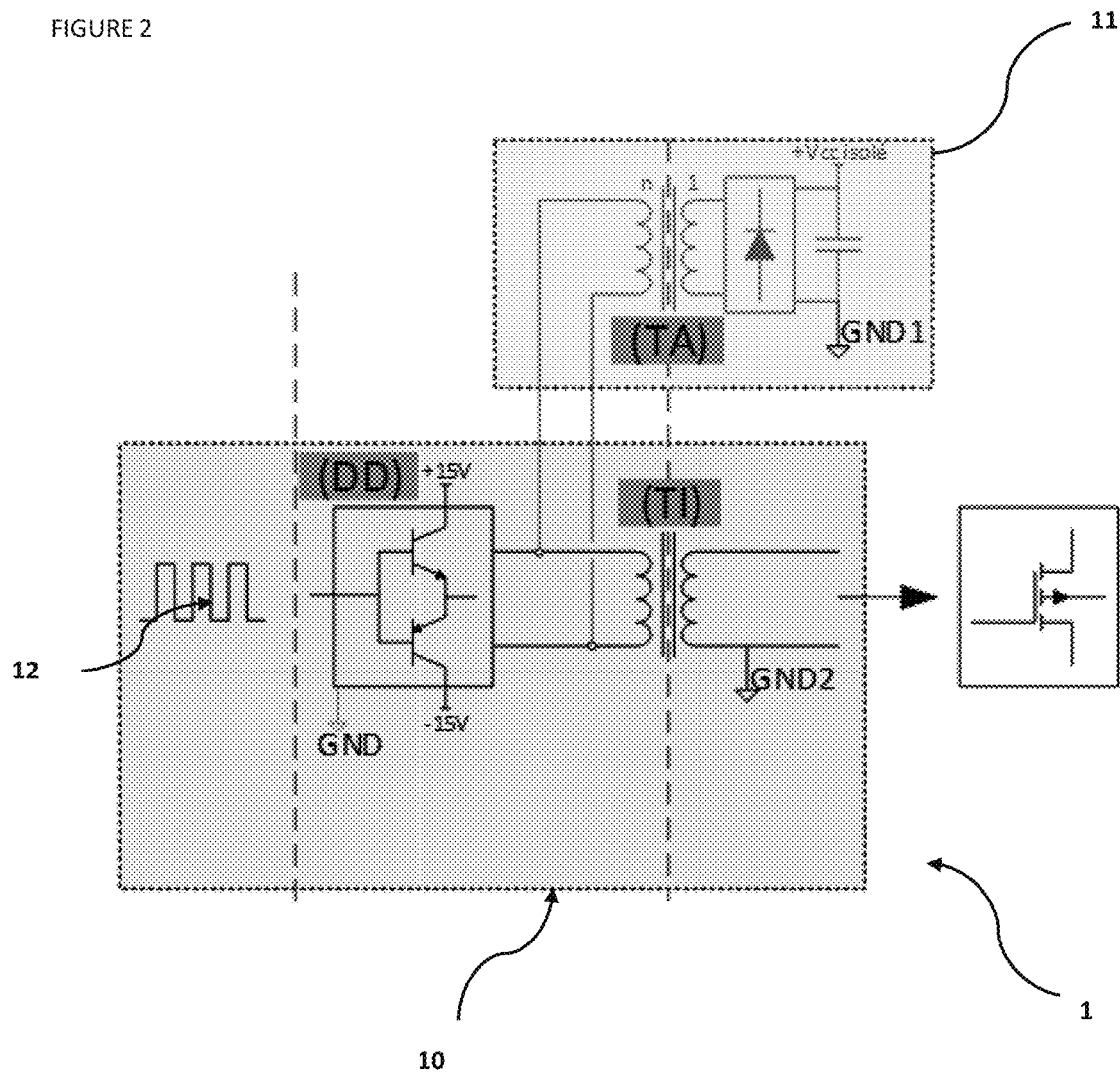
FIG. 2 is a detailed diagram of the driver stage and the generation of the isolated power supply according to an embodiment of the invention.

FIG. 2 shows an electronic system (1) in an embodiment according to the invention. Electronic system (1) therefore comprises a driver stage and a floating-ground isolated power supply (11). The driver stage, as described above, has a push-pull output non-isolated voltage and current level amplifier driver (DD) associated with a pulse transformer (TI) for isolating the signals. Within the context of the invention, control signals (12) between the output of amplifier driver (DD) and the input of pulse transformer (TI) are recovered and used to generate floating-ground isolated power supplies (11). A wire connection, such as metal (notably copper) wires, connecting the output of amplifier driver (DD) to the input of pulse transformer (TI) is therefore provided. Another connector solution uses the electronic tracks of a printed circuit board. The invention can comprise one or more floating-ground isolated power supplies.

Floating-ground isolated power supply (11) comprises a transformer (TA) with its rectifier, a diode rectifier for example, in order to create a floating-ground isolated and rectified power supply with adjustable amplitude at the output. Control signals (12) are sent to this new transformer (TA) with its rectifier.

The transformation ratio of transformer (TA) allows adjustment of the voltage level required by the consumer circuit (not shown). In a variant of the invention, a linear regulator can be added to stabilize the voltage at the output of transformer (TA).

The embodiment of FIG. 2 can comprise variant embodiments. Notably, one variant uses 2-secondary transformers, or another variant uses a 1-secondary transformer of ratio n:1, or yet another variant uses a planar transformer.

The invention described above affords the advantage of reusing existing functions in the circuit to advantageously create a floating-ground isolated and local power supply. In this sense, the invention allows decreasing the number of components and their cost, and reducing their size with the connectors and the cables are to be distributed among the various boards. It is also noted that the invention is advantageous regarding the choice of the digital computation unit. It is possible to not to have add a PWM output for managing the various floating-ground isolated power supplies, and thus to select a less costly component.

It is clear that the invention is not limited to the embodiments described above by way of example and that it encompasses any variant embodiment.

The invention claimed is:

1. An electronic power system for energy conversion, comprising:
at least one electronic driver circuit, at least one floating-ground isolated power supply and at least one digital computation unit for generating control signals, the electronic driver circuit comprises an electronic amplifier driver circuit which sends control signals to a pulse transformer associated with the at least one electronic amplifier driver circuit, and the floating-ground isolated power supply is connected to an output of the at least one electronic amplifier driver circuit so that the control signals from the electronic amplifier driver circuit are recovered and drive a floating-ground isolated power supply of the electronic power system, and wherein the floating-ground isolated power supply comprises the pulse transformer and a rectifier connected to an output of a secondary of the pulse transformer.

2. An electronic power system as claimed in claim 1, wherein the rectifier is a diode rectifier.

3. An electronic power system as claimed in claim 1, comprising an isolated current and voltage measuring device.

4. An electronic power system as claimed in claim 2, comprising an isolated current and voltage measuring device.

5. An electronic power system as claimed in claim 1, wherein the electronic amplifier driver circuit is an electronic non-isolated voltage and current level amplifier driver circuit with an output.

6. An electronic power system as claimed in claim 2, wherein the electronic amplifier driver circuit is an electronic non-isolated voltage and current level amplifier driver circuit with an output.

7. An electronic power system as claimed in claim 1, wherein the electronic amplifier driver circuit is an electronic non-isolated voltage and current level amplifier driver circuit with an output.

8. An electronic power system as claimed in claim 2, wherein the electronic amplifier driver circuit is an electronic non-isolated voltage and current level amplifier driver circuit with an output.

9. An electronic power system as claimed in claim 1, wherein the output of electronic amplifier driver circuit comprises transistors.

10. An electronic power system as claimed in claim 2, wherein the output of electronic amplifier driver circuit comprises transistors.

11. An electronic power system as claimed in claim 3, wherein the output of electronic amplifier driver circuit comprises transistors.

12. An electronic power system as claimed in claim 4, wherein the output of electronic amplifier driver circuit comprises transistors.

13. A floating-ground isolated power supply comprising a transformer and a rectifier, which supplies electrical power to an output of the electronic amplifier driver circuit of an electronic power system as claimed in claim 1.

\* \* \* \* \*